(12) United States Patent
Watanabe et al.

(10) Patent No.: US 8,323,738 B2
(45) Date of Patent: Dec. 4, 2012

(54) COATED CUTTING TOOL AND METHOD FOR PRODUCING THE SAME

(75) Inventors: Jun Watanabe, Kawasaki (JP); Yohei Sone, Kawasaki (JP)

(73) Assignee: Tungaloy Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/023,288

(22) Filed: Feb. 8, 2011

(65) Prior Publication Data
US 2011/0135822 A1 Jun. 9, 2011

Related U.S. Application Data

(62) Division of application No. 11/849,556, filed on Sep. 4, 2007, now Pat. No. 7,906,230.

(30) Foreign Application Priority Data

Sep. 5, 2006 (JP) ................................. 2006-239719

(51) Int. Cl.
*C23C 16/00* (2006.01)

(52) U.S. Cl. ....... 427/255.391; 427/255.28; 427/255.36; 427/255.39

(58) Field of Classification Search ............. 427/255.28, 427/255.31, 255.36, 255.39, 255.391
See application file for complete search history.

(56) References Cited

U.S. PATENT DOCUMENTS

| | | | |
|---|---|---|---|
| 5,920,760 A | 7/1999 | Yoshimura et al. | |
| 5,942,318 A | 8/1999 | Soderberg et al. | |
| 6,146,697 A * | 11/2000 | Undercoffer | 427/255.39 |
| 6,177,178 B1 * | 1/2001 | Ostlund et al. | 427/255.394 |
| 6,183,846 B1 | 2/2001 | Moriguchi et al. | |
| 6,200,671 B1 * | 3/2001 | Lindskog et al. | 51/309 |
| 6,293,739 B1 | 9/2001 | Uchino et al. | |
| 6,627,335 B2 | 9/2003 | Kodama et al. | |
| 6,756,111 B1 * | 6/2004 | Okada et al. | 428/698 |
| 7,422,803 B2 | 9/2008 | Ruppi | |
| 7,597,970 B2 | 10/2009 | Fukano et al. | |
| 8,012,535 B2 * | 9/2011 | Sottke et al. | 427/255.391 |
| 2001/0036388 A1 | 11/2001 | Kodama et al. | |
| 2007/0218313 A1 | 9/2007 | Okada et al. | |
| 2007/0292670 A1 | 12/2007 | Okada et al. | |

FOREIGN PATENT DOCUMENTS

| | | |
|---|---|---|
| JP | 6-158324 A | 6/1994 |
| JP | 6-158325 A | 6/1994 |
| JP | 07-062542 | 3/1995 |
| JP | 7-328808 A | 12/1995 |
| JP | 08-132130 | 5/1996 |
| JP | 8-155724 A | 6/1996 |

OTHER PUBLICATIONS

English translation of JP 08-132130, May 1996.*
English translation of JP 07-062542, Jul. 1995.*
Notice of Allowance issued by the Examiner in U.S. Appl. No. 11/849,556 on Nov. 9, 2010.
Office Action issued by the Examiner in U.S. Appl. No. 11/849,556 on Jul. 8, 2010.
Office Action issued by the Examiner in U.S. Appl. No. 11/849,556 on Mar. 26, 2010.

* cited by examiner

*Primary Examiner* — Archene Turner
(74) *Attorney, Agent, or Firm* — Foley & Lardner LLP

(57) ABSTRACT

Provided are a coated cutting tool having excellent wear resistance and excellent resistance to chipping as well as excellent fracture resistance such that the coated cutting tool is unlikely to cause backward movement of the tool edge position due to wear or chipping, and a method for producing the same.

A coated cutting tool comprising a base material having a surface coated with a coating film, wherein the coating film comprises at least one layer comprised of a TiCN columnar crystal film, wherein the TiCN columnar crystal film has an average grain size of 0.05 to 0.5 μm, as measured in the direction parallel to the surface of the base material, and exhibits an X-ray diffraction pattern having a peak at a diffraction angle 2θ in the range of from 121.5 to 122.6° wherein the peak is ascribed to the (422) crystal facet of the TiCN columnar crystal as measured using CuKα radiation.

11 Claims, No Drawings

COATED CUTTING TOOL AND METHOD FOR PRODUCING THE SAME

This application is a divisional of U.S. patent application Ser. No. 11/849,556, filed on Sep. 4, 2007, which claims priority to Japanese application number 2006-239719, filed on Sep. 5, 2006, all of which are incorporated in their entirety herein by reference.

FIELD OF THE INVENTION

The present invention relates to a coated cutting tool comprising a base material having a surface coated with a coating film. More particularly, the present invention is concerned with a coated cutting tool which comprises a base material having a surface coated with a TiCN columnar crystal film having a specific structure, and which is advantageously used in cutting for ductile cast iron, carbon steel, and others.

BACKGROUND ART

A coated cutting tool, which comprises a base material comprised of a hard material having a surface coated with a TiCN columnar crystal film deposited by a chemical vapor deposition (CVD) method at a medium-temperature such as a temperature in the range of from 700 to 900° C. using raw material gas comprising $CH_3CN$ wherein the TiCN columnar crystal film is coated with an aluminum oxide film, is widely used in cutting.

As a prior art coated cutting tool, there is a surface-coated cutting tool made of tungsten carbide-based cemented carbide, which is coated with a first layer comprised of titanium nitride, a second layer comprised of titanium carbo-nitride, a third layer comprised of titanium carbo-oxide, and a fourth layer comprised of aluminum oxide (see, for example, patent document 1). However, since the surface-coated cutting tool made of tungsten carbide-based cemented carbide is coated with a titanium carbo-nitride film deposited by a medium-temperature CVD method using raw material gas comprising $CH_3CN$, the atomic ratio of carbon to the sum of carbon and nitrogen contained in the titanium carbo-nitride film $\{C/(C+N)\}$ is as small as 0.5 to 0.6. Therefore, there is a problem in that the titanium carbo-nitride coating film has a low hardness and hence does not exhibit a satisfactory wear resistance.

As another prior art coated cutting tool, there is a coated cutting tool coated with a TiCN film using raw material gas comprising $CH_3CN$ and $CH_4$ (see, for example, patent document 2). However, when the reaction for deposition is conducted at a temperature of 900° C. or lower, only $CH_3CN$ is reacted and almost no $CH_4$ undergoes the chemical reaction. Therefore, the resultant TiCN film does not have a C/(C+N) ratio of more than 0.6, and thus the TiCN film has a low hardness and does not exhibit a satisfactory wear resistance. On the other hand, when the reaction is conducted at a temperature of higher than 900° C., the resultant TiCN coating film is comprised of coarse crystal grains, and hence is lowered in toughness, causing a problem in that the fracture resistance is poor.

[Patent document 1] Japanese Unexamined Patent Publication No. Hei 07-328808
[Patent document 2] Japanese Unexamined Patent Publication No. Hei 06-158324

DISCLOSURE OF THE INVENTION

Problems to be Solved by the Invention

In recent years, in the field of machining, there are increasing demands for machined products having high quality, particularly having an improved accuracy of machining dimension. Further, the materials to be cut are increased in hardness or they become more difficult to cut year by year, and, when such materials are cut by means of a conventional cutting tool, backward movement of the tool edge position is likely to occur due to wear or chipping of the relief surface portion, leading to a disadvantage in that the machining dimension of the materials to be cut falls outside of the prescribed range in a short machining time. In the machining sites, for keeping the accuracy of the machining dimension of the materials to be cut within the prescribed range, the tool edge position is frequently corrected, which lowers the machining efficiency. Therefore, a cutting tool more unlikely to cause backward movement of the tool edge position has been desired by the machining sites. Accordingly, an object of the present invention is to provide a coated cutting tool having excellent wear resistance and excellent resistance to chipping as well as excellent fracture resistance such that the coated cutting tool is unlikely to cause backward movement of the tool edge position due to wear or chipping, and a method for producing the same.

Means to Solve the Problems

The present inventors have conducted extensive and intensive studies with a view toward developing a coated cutting tool unlikely to cause backward movement of the tool edge position due to wear or chipping of the tool edge. As a result, it has been found that, when a TiCN columnar crystal film is deposited on the surface of a base material by a medium-temperature CVD method at 700 to 900° C. using raw material gas comprising an organic cyanogen compound, such as $CH_3CN$, a chain hydrocarbon having carbon atoms of from 2 to 20 thus excluding $CH_4$, such as $C_2H_4$, $C_2H_6$, $C_3H_6$, or $C_3H_8$, titanium tetrachloride, and hydrogen, the resultant TiCN columnar crystal film is increased in hardness without lowering the strength, as compared to a conventional TiCN film deposited without using the chain hydrocarbon excluding $CH_4$. The coated cutting tool obtained by the present invention has excellent wear resistance and excellent resistance to chipping as well as excellent fracture resistance. Therefore, backward movement of the tool edge position due to wear or chipping is suppressed, making it possible to keep an accuracy of the machining dimension and to reduce the operations correcting the tool edge position due to the change of dimension.

The coated cutting tool of the present invention comprises a base material having a surface coated with a coating film, wherein the coating film comprises at least one layer comprised of a TiCN columnar crystal film. Specifically, in the present invention, a TiCN columnar crystal film is formed directly on a base material or formed through an innermost film formed on the base material. The TiCN columnar crystal film has an average grain size of 0.05 to 0.5 μm, as measured in the direction parallel to the surface of the base material, and exhibits an X-ray diffraction pattern having a peak at a diffraction angle 2θ in the range of from 121.5 to 122.6° wherein the peak is ascribed to the (422) crystal facet of the TiCN columnar crystal as measured using CuKα radiation.

Specific examples of the coated cutting tools of the present invention include cutting chip, end mill, drill, and reamer. The base material used in the coated cutting tool of the present invention is a material which has conventionally been used as a base material in the coated cutting tool, and specific examples include cemented carbide, cermet, ceramic, and sintered materials of cubic boron nitride. Cemented carbide is more preferred as the base material in the coated cutting tool of the present invention because of the wear resistance and fracture resistance.

The coating film comprising a TiCN columnar crystal film in the present invention is comprised of at least one member selected from a carbide, a nitride, and an oxide of an element belonging to Group 4a (Ti, Zr, Hf), 5a (V, Nb, Ta), or 6a (Cr, Mo, W) of the Periodic Table or Al and a mutual solid solution thereof. Specific examples include TiC, TiN, TiCN, TiCO, TiCNO, TiCNO, TiAlCNO, and $Al_2O_3$. It is preferred that the whole coating film has an average thickness of 7 to 25 μm. When the whole coating film has an average thickness of less than 7 μm, the wear resistance becomes poor. On the other hand, when the whole coating film has an average thickness of more than 25 μm, the fracture resistance becomes poor.

The atomic ratio of carbon to the sum of carbon and nitrogen contained in the TiCN columnar crystal film in the present invention {C/(C+N)} is higher than that of a conventional TiCN film, and the lattice constant of the TiCN columnar crystal film in the present invention is larger than that of a conventional TiCN film. For this reason, the X-ray diffraction angle 2θ of the peak of the TiCN columnar crystal film in the present invention shifts to the low angle side, as compared to the X-ray diffraction angle 2θ of the peak of the conventional TiCN film. When the TiCN columnar crystal film in the present invention is subjected to X-ray diffraction using CuKα radiation, the TiCN columnar crystal film exhibits an X-ray diffraction pattern having a peak at a diffraction angle 2θ in the range of from 121.5 to 122.6° wherein the peak is ascribed to the (422) crystal facet of the TiCN columnar crystal. When the diffraction angle 2θ of the peak ascribed to the (422) crystal facet of the film is less than 121.5°, the TiCN film has a high hardness such that the strength of the film is lowered. On the other hand, when the diffraction angle 2θ is more than 122.6°, the TiCN film has a low hardness such that the wear resistance of the film is lowered. The TiCN columnar crystal film has an average grain size of 0.05 to 0.5 μm, as measured in the direction parallel to the surface of the base material. When the average grain size is less than 0.05 μm, the TiCN columnar crystals are extremely fine and hence likely to suffer a breakage. On the other hand, when the average grain size is more than 0.5 μm, the TiCN columnar crystal film is lowered in fracture resistance. The average grain size of the TiCN columnar crystal film in the direction parallel to the surface of the base material can be measured by observing the cross-section of the coating film under a scanning electron microscope or a transmission electron microscope. Specifically, the grain size of the TiCN columnar crystal film can be easily measured by a method in which a cemented carbide base material having a surface coated with a coating film is subjected to heating treatment in a vacuum or a hydrogen gas atmosphere at a temperature of 1,100 to 1,200° C. for 1 to 90 minutes to diffuse the metallic bonding phase of the cemented carbide base material through the grain boundary in the TiCN columnar crystal coating film, and then the mirror polished cross-section of the coating film is observed under a SEM.

In the present invention, it is preferred that a value of the half width of the peak ascribed to the (422) crystal facet of the TiCN columnar crystal film is in the range of from 0.40 to 0.60° since the TiCN columnar crystal film is improved in fracture resistance. When the value of the half width of the peak ascribed to the (422) crystal facet of the film is 0.40° or more, the average grain size thereof is fine and the fracture resistance thereof is improved. When the value of the half width of the peak ascribed to the (422) crystal facet of the film is more than 0.60°, the average grain size thereof is too fine and hence the TiCN columnar crystals are likely to suffer a breakage. Therefore, the value of the half width of the peak ascribed to the (422) crystal facet of the TiCN columnar crystal film is preferably in the range of from 0.40 to 0.60°. A value of the half width of the peak ascribed to the (422) crystal facet of the film can be measured under the following conditions for measurement.

Characteristic X-ray: CuKα radiation;
Monochromator: Ni;
Divergence slit: ½°;
Scatter slit: ⅔°;
Receiving slit: 0.15 mm;
Sampling interval: 0.01°

In the present invention, it is preferred that the TiCN columnar crystal film exhibits an X-ray diffraction pattern having the highest intensity at the peak ascribed to the (422) crystal facet since the toughness of the TiCN columnar crystal film is enhanced, improving the resistance to chipping. In the present invention, it is preferred that the TiCN columnar crystal film has a C/(C+N) ratio of 0.70 to 0.90. When the C/(C+N) ratio is 0.70 or more, the wear resistance is improved, and, when the ratio is more than 0.90, the fracture resistance tends to be lowered.

The TiCN columnar crystal film in the present invention can be deposited using raw material gas comprising a chain hydrocarbon having carbon atoms of from 2 to 20 thus excluding $CH_4$, an organic cyanogen compound, titanium tetrachloride, and hydrogen at a deposition temperature of 700 to 900° C. Specifically, there can be mentioned conditions for deposition such that the deposition temperature is 700 to 900° C., the pressure is 5 to 10 kPa, and the raw material gas comprises 1.0 to 4.0 mol % of a chain hydrocarbon having carbon atoms of from 2 to 20, 0.1 to 0.5 mol % of $CH_3CN$, 1.0 to 4.0 mol % of $TiCl_4$, and the balance of $H_2$. The organic cyanogen compound is both a carbon source and a nitrogen source for the TiCN columnar crystal film and the chain hydrocarbon having carbon atoms of from 2 to 20 is a carbon source for the TiCN columnar crystal film. Specific examples of the chain hydrocarbons having carbon atoms of from 2 to 20 include saturated hydrocarbons having a chain structure, such as $C_2H_6$ and $C_3H_8$, and unsaturated hydrocarbons having a chain structure, such as $C_2H_4$ and $C_3H_6$. The reason that $CH_4$ with carbon atom of 1 is excluded from the chain hydrocarbon resides in that $CH_4$ has a high decomposition temperature such that it cannot be a carbon source in the medium-temperature CVD method at a deposition temperature of 700 to 900° C. When the number of carbon atoms for the chain hydrocarbon is in the range from 2 to 20, the chain hydrocarbon can be introduced into a reaction chamber in a gaseous condition with other raw material gas in a conventional CVD method. This is because that a boiling temperature of the chain hydrocarbon having carbon atoms of from 2 to 20 is not so high. Carbon atoms of the chain hydrocarbon are preferably from 2 to 6 and more preferably from 2 to 3. Specific examples of the organic cyanogen compounds include $CH_3CN$ (acetonitrile), $CH_3CH_2CN$ (propanitrile), and $C_6H_5CN$ (benzonitrile).

In the present invention, it is preferred that the TiCN columnar crystal film is formed by a medium-temperature CVD method at a deposition temperature of 700 to 900° C. The reason for this is as follows. When the deposition temperature is lower than 700° C., a chemical reaction for forming TiCN is unlikely to proceed, so that the deposition time is prolonged, lowering the productivity of the film. On the other hand, when the deposition temperature is higher than 900° C., the average grain size of the TiCN columnar crystal film in the direction parallel to the base material is coarsened, deteriorating the fracture resistance of the film.

The coated cutting tool of the present invention can be produced by a method for producing a coated cutting tool, comprising the steps of: elevating the temperature of a base material to a deposition temperature; depositing on the base material a TiCN columnar crystal film by a CVD method at a temperature in the range of from 700 to 900° C. using raw material gas comprising a chain hydrocarbon having carbon atoms of from 2 to 20, an organic cyanogen compound, titanium tetrachloride, and hydrogen; and cooling the base material coated with a coating film.

In the present invention, it is preferred that the TiCN columnar crystal film has an average thickness of 5 to 20 μm. When the average thickness of the film is less than 5 μm, the wear resistance at the relief surface is poor. On the other hand, when the average thickness is more than 20 μm, the tool edge is likely to suffer fracture. It is more preferred that the TiCN columnar crystal film has an average thickness of 7 to 15 μm.

Since aluminum oxide has excellent oxidation resistance, it is preferred to have an outer film comprising at least one layer of aluminum oxide film. The TiCN columnar crystal film of the present invention is preferably formed directly on the base material or formed on the innermost TiN film formed on the base material. The aluminum oxide film in the present invention preferably has an average thickness of 1.5 to 10 μm, further preferably 3 to 8 μm. When the average thickness of the aluminum oxide film is less than 1.5 μm, the cutting tool has an unsatisfactory crater wear resistance at the cutting face. On the other hand, when the average thickness is more than 10 μm, the tool edge is likely to suffer fracture. It is preferred that the aluminum oxide film has an α-type crystal structure since the α-aluminum oxide is more stable at high temperatures than aluminum oxide of the other crystal structure. The α-aluminum oxide film is unlikely to cause fracture or chipping when the tool edge is at a high temperature in the high-speed cutting particularly for carbon steel or alloy steel.

Effect of the Invention

The coated cutting tool of the present invention exhibits excellent wear resistance and excellent resistance to chipping as well as excellent fracture resistance. When using the coated cutting tool of the present invention, backward movement of the edge position due to wear or chipping is advantageously suppressed, thus making it possible to keep an accuracy of the machining dimension of the material to be cut and to reduce the operations correcting the tool edge position.

EXAMPLE 1

As a base material, a cutting chip made of cemented carbide, having a CNMG120412 form specified in JIS, and having a composition: 91.5 wt % WC-0.5 wt % TiC-1.8 wt % TaC-0.2 wt % NbC-6.0 wt % Co, was prepared. The cutting edge portion of the base material was subjected to round honing by means of a SiC brush, and then the surface of the base material was washed. Then, the resultant base material was placed in a CVD chamber with an external heating system, and a coating film was deposited on the surface of the base material using high-purity gas having a purity of 99.5% by volume or more shown in Table 1 or 2 under the deposition conditions shown in Table 1 or 2 so that the coating film was comprised of the film structures each having the average thickness shown in Table 3. Table 1 shows the deposition conditions for inner films and Table 2 shows the deposition conditions for outer films including an intermediate film, and, in invention samples 1 to 6, chain hydrocarbon having carbon atoms of 2 or 3 was used as raw material gas.

TABLE 1

| Sample No. | Type of film | Composition of raw material gas (mol %) | Temperature (° C.) | Pressure (kPa) | Flow rate (L/min) |
|---|---|---|---|---|---|
| Invention samples 1,2 | Innermost TiN film | $TiCl_4$: 2.4%, $N_2$: 48.8%, $H_2$: 48.8% | 880 | 40.0 | 30.7 |
| | TiCN columnar crystal film | $TiCl_4$: 1.5%, $CH_3CN$:0.3%, $C_2H_6$:3.2%, $H_2$: 95.0% | 880 | 8.0 | 15.8 |
| Invention samples 3,4 | Innermost TiN film | $TiCl_4$: 2.4%, $N_2$: 48.8%, $H_2$: 48.8% | 830 | 40.0 | 30.7 |
| | TiCN columnar crystal film | $TiCl_4$: 3.0%, $CH_3CN$:0.2%, $C_2H_4$:2.1%, $H_2$: 94.7% | 830 | 8.0 | 15.7 |
| Invention sample 5 | Innermost TiN film | $TiCl_4$: 2.4%, $N_2$: 48.8%, $H_2$: 48.8% | 780 | 40.0 | 30.7 |
| | TiCN columnar crystal film | $TiCl_4$: 3.0%, $CH_3CN$:0.2%, $C_3H_6$: 1.2%, $H_2$: 95.6% | 780 | 8.0 | 15.7 |
| Invention sample 6 | Innermost TiN film | $TiCl_4$: 2.4%, $N_2$: 48.8%, $H_2$: 48.8% | 780 | 40.0 | 30.7 |
| | TiCN columnar crystal film | $TiCl_4$: 2.9%, $CH_3CN$: 0.1%, $C_3H_6$:1.6%, $H_2$: 95.4% | 780 | 8.0 | 15.7 |
| Comparative samples 1,2 | Innermost TiN film | $TiCl_4$: 2.4%, $N_2$: 48.8%, $H_2$: 48.8% | 880 | 40.0 | 30.7 |
| | TiCN columnar crystal film | $TiCl_4$: 1.1%, $CH_3CN$: 1.3, $N_2$: 48.8%, $H_2$: 48.8% | 880 | 8.0 | 20.5 |
| Comparative sample 3 | Innermost TiN film | $TiCl_4$: 2.4%, $N_2$: 48.8%, $H_2$: 48.8% | 880 | 40.0 | 30.7 |
| | TiCN columnar crystal film | $TiCl_4$: 3.0%, $CH_3CN$: 0.8%, $H_2$: 96.2% | 880 | 8.0 | 15.6 |
| Comparative samples 4,5 | Innermost TiN film | $TiCl_4$: 2.4%, $N_2$: 48.8%, $H_2$: 48.8% | 830 | 40.0 | 30.7 |
| | TiCN columnar crystal film | $TiCl_4$: 3.0%, $CH_3CN$: 0.3%, $H_2$: 96.7% | 830 | 8.0 | 15.6 |

TABLE 1-continued

| Sample No. | Type of film | Composition of raw material gas (mol %) | Temperature (° C.) | Pressure (kPa) | Flow rate (L/min) |
|---|---|---|---|---|---|
| Comparative sample 6 | Innermost TiN film | $TiCl_4$: 2.4%, $N_2$: 48.8%, $H_2$: 48.8% | 950 | 40.0 | 30.7 |
| | TiCN columnar crystal film | $TiCl_4$: 1.2%, $CH_3CN$: 0.2%, $CH_4$: 16.0%, HCl: 2.7%, $H_2$: 79.9% | 950 | 24.0 | 18.8 |

TABLE 2

| Sample No. | Type of film | Composition of raw material gas (mol %) | Temperature (° C.) | Pressure (kPa) | Flow rate (L/min) |
|---|---|---|---|---|---|
| Invention sample 1 and Comparative sample 1 | Intermediate film (TiCO) | $TiCl_4$: 2.2%, CO: 3.9%, $H_2$: 93.9% | 980 | 18.7 | 12.8 |
| | Aluminum oxide film ($\kappa$-$Al_2O_3$) | $AlCl_3$: 2.5%, $CO_2$: 4.5%, CO: 4.4%, HCl: 4.0%, $H_2S$: 0.4%, $H_2$: 84.2% | 980 | 7.3 | 16.1 |
| | Outermost TiN film | $TiCl_4$: 0.8%, $N_2$: 49.6%, $H_2$: 49.6% | 980 | 40.0 | 30.2 |
| Invention samples 2~6 and Comparative samples 2~6 | Intermediate film (TiAlCNO) | $TiCl_4$: 0.9%, $AlCl_3$: 0.8%, $N_2$: 44.8%, CO: 0.9%, $H_2$: 52.6% | 1000 | 8.0 | 33.5 |
| | Aluminum oxide file ($\alpha$-$Al_2O_3$) | $AlCl_3$: 0.9%, $CO_2$: 2.6%, CO: 10.4%, HCl: 6.5%, $H_2S$: 0.4%, $H_2$: 79.2% | 1000 | 8.0 | 23.1 |
| | Outermost TiN film | $TiCl_4$: 0.8%, $N_2$: 49.6%, $H_2$: 49.6% | 1000 | 40.0 | 30.2 |

TABLE 3

| | Film structures and average thickness of each film (μm) | | | | | Average thickness of coating film (μm) |
|---|---|---|---|---|---|---|
| | Inner film | | | Outer film | | |
| | | TiCN | | | | |
| Sample No. | Innermost TiN film | columnar crystal film | Intermediate film | Aluminum oxide film | Outermost TiN film | |
| Invention sample 1 | 1.0 | 8.0 | 0.2 (TiCO) | 4.9 ($\kappa$-$Al_2O_3$) | 0.5 | 14.6 |
| Invention sample 2 | 1.0 | 7.9 | 0.5 (TiAlCNO) | 4.7 ($\alpha$-$Al_2O_3$) | 0.3 | 14.4 |
| Invention sample 3 | 0.3 | 13.2 | 0.7 (TiAlCNO) | 9.4 ($\alpha$-$Al_2O_3$) | 0.3 | 23.9 |
| Invention sample 4 | 0.3 | 18.8 | 0.6 (TiAlCNO) | 1.6 ($\alpha$-$Al_2O_3$) | 0.3 | 21.6 |
| Invention sample 5 | 0.2 | 8.3 | 0.8 (TiAlCNO) | 3.1 ($\alpha$-$Al_2O_3$) | 0.4 | 12.8 |
| Invention sample 6 | 0.2 | 5.8 | 0.7 (TiAlCNO) | 1.8 ($\alpha$-$Al_2O_3$) | 0.2 | 8.7 |
| Comparative sample 1 | 1.0 | 7.9 | 0.2 (TICO) | 4.8 ($\kappa$-$Al_2O_3$) | 0.5 | 14.4 |
| Comparative sample 2 | 11 | 8.0 | 0.6 (TiAlCNO) | 5.0 ($\alpha$-$Al_2O_3$) | 0.4 | 15.1 |
| Comparative sample 3 | 1.1 | 19.3 | 0.5 (TiAlCNO) | 3.9 ($\alpha$-$Al_2O_3$) | 0.2 | 25.0 |
| Comparative sample 4 | 0.3 | 10.1 | 0.8 (TiAlCNO) | 9.1 ($\alpha$-$Al_2O_3$) | 0.3 | 20.6 |
| Comparative sample 5 | 0.3 | 6.1 | 0.8 (TiAlCNO) | 3.1 ($\alpha$-$Al_2O_3$) | 0.3 | 10.6 |
| Comparative sample 6 | 1.3 | 10.2 | 0.6 (TiAlCNO) | 4.1 ($\alpha$-$Al_2O_3$) | 0.3 | 16.5 |

For the obtained invention samples 1 to 6 and comparative samples 1 to 6, an X-ray diffraction analysis was conducted using CuKα radiation to measure a diffraction angle 2θ of the peak ascribed to the (422) crystal facet of the TiCN columnar crystal film, a value of the half width of the peak, and a crystal face of the peak at which the TiCN columnar crystal film has the highest intensity in the X-ray diffraction pattern. Next, a cross-section of the coating film cut in the direction perpendicular to the surface of the base material was subjected to mirror polishing, and a C content and a N content of the TiCN columnar crystal film were quantitatively determined by EPMA, and a C/(C+N) ratio of the TiCN film was calculated. Further, the resultant sample was subjected to heat treatment in a vacuum at 1,200° C. for 10 minutes to diffuse the metallic bonding phase of the cemented carbide base material through the grain boundary in the TiCN columnar crystal coating film, and then the mirror polished surface of the normal cross-section was examined under a SEM to take a photomicrograph. On the photomicrograph of the TiCN columnar crystal film at its middle portion, a line parallel to the interface of the cemented carbide base material was drawn, and the number of grain boundaries in the TiCN columnar crystal film on the line having an arbitrary length was measured, and an average grain size of the film was calculated. The results are shown in Table 4.

TABLE 4

| | TiCN columnar crystal film | | | | |
|---|---|---|---|---|---|
| Sample No. | Diffraction angle 2θ of peak ascribed to (422) crystal facet | Value of half width of peak ascribed to (422) crystal facet | Crystal face of peak at which TiCN columnar crystal film has highest intensity in X-ray diffraction pattern | C/(C + N) Ratio | Average grain size in direction parallel to base material (μm) |
| Invention sample 1 | 122.4° | 0.42° | (111) | 0.74 | 0.42 |
| Invention sample 2 | 122.4° | 0.41° | (111) | 0.75 | 0.46 |
| Invention sample 3 | 122.1° | 0.46° | (422) | 0.81 | 0.20 |
| Invention sample 4 | 122.1° | 0.44° | (422) | 0.81 | 0.21 |
| Invention sample 5 | 122.1° | 0.49° | (422) | 0.82 | 0.14 |
| Invention sample 6 | 121.8° | 0.56° | (422) | 0.90 | 0.08 |
| Comparative sample 1 | 123.5° | 0.29° | (111) | 0.50 | 0.45 |
| Comparative sample 2 | 123.5° | 0.29° | (111) | 0.51 | 0.44 |
| Comparative sample 3 | 123.1° | 0.33° | (111) | 0.60 | 0.37 |
| Comparative sample 4 | 123.1° | 0.38° | (422) | 0.59 | 0.25 |
| Comparative sample 5 | 123.1° | 0.38° | (422) | 0.60 | 0.26 |
| Comparative sample 6 | 122.3° | 0.28° | (220) | 0.78 | 1.13 |

With respect to each of the cutting chips of invention samples 1 to 6 and comparative samples 1 to 6, a cutting test was conducted under the conditions shown below using, as a material to be cut, doughnut disc FCD700 (hardness: HB240) having an outer diameter of 180 mm, an inner diameter of 60 mm, and a thickness of 20 mm.

Cutting Test

Cutting speed: Vc=250 m/min

Cut depth: ap=2 mm

Feed: f=0.35 mm/rev

Coolant: Water-soluble cutting liquid used

Cutting mode: One pass cutting for each of the both edge faces per one doughnut disc material is continuously performed.

Cutting performance: The number of the doughnut disc materials cut until the cut material has a thickness larger by 0.05 mm than the average thickness of the 4th to 6th materials from the start of the cutting is used as cutting performance of the cutting chip.

With respect to each of invention samples 1 to 6 and comparative samples 1 to 6, the number of the cut materials and the damage of the cutting chip after the cutting test are shown in Table 5.

TABLE 5

| Sample No. | Number of cut materials | Damage |
|---|---|---|
| Invention samples 1 | 102 | Normal wear |
| Invention samples 2 | 115 | Normal wear |
| Invention samples 3 | 170 | Normal wear |
| Invention samples 4 | 180 | Normal wear |
| Invention samples 5 | 143 | Normal wear |
| Invention samples 6 | 145 | Normal wear |
| Comparative samples 1 | 35 | Chipping |
| Comparative samples 2 | 45 | Chipping |
| Comparative samples 3 | 36 | Fracture |
| Comparative samples 4 | 61 | Normal wear |
| Comparative samples 5 | 44 | Normal wear |
| Comparative samples 6 | 17 | Fracture |

As can be seen from Table 5, invention samples 1 to 6 individually have excellent wear resistance, excellent resistance to chipping, and excellent fracture resistance, and hence are unlikely to cause backward movement of the tool edge position, and exhibit the large number of the materials to be cut, as compared to comparative samples 1 to 6.

The invention claimed is:

1. A method for producing a coated cutting tool, comprising depositing a TiCN columnar crystal film by a CVD method at a temperature in the range of from 700 to 900° C. using raw material gas comprising 1.0 to 4.0 mol% of a chain hydrocarbon having carbon atoms of from 2 to 20, 0.1 to 0.5 mol% of an organic cyanogen compound, 1.0 to 4.0 mol% of titanium tetrachloride, and the balance of hydrogen, provided that nitrogen gas is excluded from the raw material gas.

2. The method according to claim 1, wherein a value of the half width of the peak ascribed to the (422) crystal facet of the TiCN columnar crystal film is 0.40 to 0.60°.

3. The method according to claim 1, wherein the TiCN columnar crystal film exhibits an X-ray diffraction pattern having the highest intensity at the peak ascribed to the (422) crystal facet.

4. The method according to claim 1, wherein the atomic ratio of carbon to the sum of carbon and nitrogen contained in the TiCN columnar crystal film {C/(C+N)} is 0.70 to 0.90.

5. The method according to claim 1, wherein the CVD method is carried out at a pressure of 5 to 10 kPa.

6. The method according to claim 1, wherein the chain hydrocarbon is selected from saturated hydrocarbons having a chain structure and unsaturated hydrocarbons having a chain structure.

7. The method according to claim 1, wherein the chain hydrocarbon has 2 to 6 carbon atoms.

8. The method according to claim 1, wherein the chain hydrocarbon has 2 to 3 carbon atoms.

9. The method according to claim 1, wherein the chain hydrocarbon is selected from $C_2H_6$, $C_3H_8$, $C_2H_4$ and $C_3H_6$.

10. The method according to claim 1, wherein the organic cyanogen compound is selected from $CH_3CN$, $CH_3CH_2CN$ and $C_6H_5CN$.

11. The method according to claim 9, wherein the organic cyanogen compound is selected from $CH_3CN$, $CH_3CH_2CN$ and $C_6H_5CN$.

* * * * *